United States Patent [19]

Davidson

[11] 4,194,912

[45] Mar. 25, 1980

[54] WATER BASED PHOTORESIST

[75] Inventor: Edmund B. Davidson, Short Hills, N.J.

[73] Assignee: RCA Corporation, New York, N.Y.

[21] Appl. No.: 837,166

[22] Filed: Sep. 28, 1977

Related U.S. Application Data

[63] Continuation of Ser. No. 410,392, Oct. 29, 1973, abandoned.

[51] Int. Cl.$^2$ .................. G03C 5/00; G03C 1/495; G03C 1/66
[52] U.S. Cl. .................. 430/322; 430/281; 430/289
[58] Field of Search .................. 96/93, 115 R, 33, 36, 96/36.3, 35.1; 204/159.15, 159.17, 159.24

[56] References Cited

U.S. PATENT DOCUMENTS

| | | | |
|---|---|---|---|
| 2,604,388 | 7/1952 | Staehle | 96/93 X |
| 2,687,958 | 8/1954 | Neugebauer | 96/93 X |
| 2,937,085 | 5/1960 | Seven et al. | 96/93 X |
| 3,154,479 | 10/1964 | Onishi et al. | 204/159.2 X |
| 3,205,156 | 9/1965 | Atarashi | 204/159.17 |
| 3,265,527 | 8/1966 | Adelman | 96/93 X |
| 3,651,170 | 3/1972 | Silver | 96/93 X |
| 3,759,711 | 9/1973 | Rauner et al. | 96/115 R X |
| 3,778,270 | 12/1973 | Roos | 96/75 |

FOREIGN PATENT DOCUMENTS 665829  7/1963  Canada .................. 96/93

OTHER PUBLICATIONS

Datta, P. et al., *A Study of Photochemical Reactions in a Dichromated Photoresist*, (Paper Submitted at Int. Symposium on Advances in Photopolymer Systems-11/1978), pp. 25–28.

Hopkins et al., "Gen. Chem. for Colleges," D. C. Heath & Co., 1956, pp. 609–610.

Kirk–Othmar, "Encyclopedia of Chem. Tech.," vol. 17, 2nd Ed., pp. 406–407.

Kosar, J., "Light–Sensitive Systems," Wiley & Sons, 1965, pp. 51–54 and 67–71.

Saunders, T. F., "IBM Tech. Discl. Bulletin," vol. 10, No. 1, 6/1967, p. 64.

*Primary Examiner*—Charles L. Bowers, Jr.
*Attorney, Agent, or Firm*—Birgit E. Morris

[57] ABSTRACT

A positive-acting water-based photoresist comprising a polyethylene imine, a dichromate sensitizer and the balance water.

3 Claims, No Drawings

WATER BASED PHOTORESIST

This is a continuation of application Ser. No. 410,392, filed Oct. 29, 1973, now abandoned.

BACKGROUND OF THE INVENTION

"Resists" are materials that are resistant to the dissolving action of certain solvents. Photoresists are resists that are also light-sensitive in that exposure to some form of actinic radiation causes them to at least partially change chemically from one to the other of two alternative forms. One of these forms is resistant to certain solvents and the other is soluble in those solvents.

Most photoresists change from a soluble to an insoluble form when they are exposed to light. These are known as "negative" photoresists because the areas of photoresist remaining after development of an image are those that have been exposed to light. The parts that have been hardened are the negative of the shaded parts of the image or photomask.

Some photoresists are of the "positive" acting type. That is, when they are exposed to light, they change from being soluble in one type of solvent to being soluble in a different type of solvent and development of the photoresist occurs where light has impinged thereon.

Although some photoresists comprise resinous materials which are photosensitive without the addition of other substances, most photoresists include a "sensitizer" which increases their light-sensitivity to a level that is suited for practical use.

Most previously used photoresist compositions include one or more organic solvents as vehicles and, after exposure, they are also developed with organic solvents. This limits their use somewhat since they cannot be used on substrates which are attacked by the developer solvents. Also, organic solvents are both fire and health hazards. Special precautions and special equipment must be used in handling them.

The present invention provides a novel photoresist composition which is soluble in water. When a film of the composition is dried, the dried film is insoluble in water. However, the resist is a positive-working type and after the film is exposed to ultra-violet light, the portions exposed to light become soluble in warm water.

EXAMPLE

A photoresist composition in accordance with the present invention may comprise: a 5% by weight aqueous solution of polyethylene imine containing an amount of a dichromate such as sodium dichromate, as sensitizer, equal to 10% by weight of the polymer. The polyethylene imine should have a molecular weight such that it dries to a non-tacky film when the aqueous solvent is removed. An example of a suitable polymer is Dow Chemical Co.'s Montrek 1000.

A film of this composition is prepared by spin-coating the composition on a surface such as a glass substrate. When the film is dried, it is water-insoluble. Drying can be hastened by heating the film with an infra-red lamp.

The dried film is utilized by exposing it to a pattern of light and shadow with a 1000 watt mercury collimated light source. With the light source at a distance of 14 inches, exposures of 6–12 minutes produce good replicas. The exposed film is developed with a spray of warm water. The film is more soluble where it has been exposed to light.

The percentage of polyethylene imine in the composition can be varied considerably. Preferably, the percentage is 1–20% by weight. If thicker films of photoresist are desired, the amount of the polymer is increased. If thinner films are wanted, the amount of the polymer is decreased. A 5% by weight composition produces a film about 1 micron thick.

The amount of the dichromate may comprise about 5–15% by weight of the imine. Dichromates other than sodium dichromate, for example, ammonium dichromate or potassium dichromate, can also be used.

I claim:

1. In a method of recording information whereby a photosensitive layer that becomes more soluble in a developer solvent after exposure to actinic radiation is coated on a substrate, exposed to a light pattern and developed with a developer solvent so as to remove the solubilized portion, the improvement which comprises employing as the photosensitive layer a composition comprising from about 1 to 20 percent by weight of polyethylene imine having a molecular weight high enough so that it dries to form a non-tacky film, about 5 to 15 percent by weight of a dichromate sensitizer, said percentages based on the total weight of said composition, and the balance water, and wherein the developer solvent is water.

2. A method according to claim 1 wherein said dichromate is sodium dichromate.

3. A method according to claim 1 wherein said actinic radiation is ultra violet light.

* * * * *